United States Patent [19]

Tietz

[11] 4,193,007

[45] Mar. 11, 1980

[54] EMITTER COUPLED LOGIC MASTER-SLAVE FLIP-FLOP WITH EMITTER-FOLLOWER CLOCK ENTRY

[75] Inventor: Gary W. Tietz, San Jose, Calif.

[73] Assignee: National Semiconductor Corporation, Santa Clara, Calif.

[21] Appl. No.: 914,524

[22] Filed: Jun. 12, 1978

[51] Int. Cl.² .............................................. H03K 3/286
[52] U.S. Cl. ................................ 307/291; 307/299 A; 365/155
[58] Field of Search ............................ 307/291, 299 A; 365/154, 155, 179

[56] References Cited

U.S. PATENT DOCUMENTS

| | | | |
|---|---|---|---|
| 3,440,449 | 4/1969 | Priel | 307/291 |
| 3,617,776 | 11/1971 | Priel et al. | 307/291 |
| 3,621,289 | 11/1971 | Sasaki | 307/291X |

*Primary Examiner*—John Zazworsky
*Attorney, Agent, or Firm*—Brown & Martin

[57] ABSTRACT

A master-slave flip-flop, wherein a master latch circuit and a slave latch circuit each include only one pair of single-emitter bipolar transistors and one pair of dual-emitter bipolar emitter-follower transistors, is disclosed. In each circuit the first emitters of the dual-emitter transistors are cross-coupled to the bases of the single emitter transistors, and the bases of the dual-emitter transistors are coupled to the collectors of the single-emitter transistors. In the master latch circuit the bases of the single-emitter transistors are respectively coupled to complementary data input terminals. The bases of the single-emitter transistors in the slave latch circuit are coupled to the second emitters of the dual-emitter transistors of the master latch circuit. The second emitters of the dual-emitter transistors of the slave latch circuit are coupled to complementary output terminals. The emitter-follower transistors of the master and slave latch circuits are respectively clocked by complementary clock signals. During one clock signal interval the master latch circuit latches the complementary data signals from the complementary data input terminals onto the second emitter terminals of its emitter-follower transistors, while the signal state on the complementary output terminals from the slave latch circuit remains unchanged. During the complementary clock signal interval the data signals from the second emitter terminals of the master latch circuit are latched onto the complementary output terminals.

1 Claim, 2 Drawing Figures

EMITTER COUPLED LOGIC MASTER-SLAVE FLIP-FLOP WITH EMITTER-FOLLOWER CLOCK ENTRY

BACKGROUND OF THE INVENTION

The present invention generally pertains to emitter-coupled logic circuits and is particularly directed to an improvement in master-slave flip-flops.

Master-slave flip-flops are useful in various electronic circuits, such as a toggle flip-flop or a shift register, for example. A typical prior art master-slave flip-flop is shown in FIG. 1.

A master-slave flip-flop includes a master latch circuit 10 and a slave latch circuit 11. Complementary clock signals CLK and $\overline{CLK}$ are provided on lines 13 and 14 respectively from a clock buffer circuit 15 to control the operation of the master-slave flip-flop. During one clock signal interval the master latch circuit 10 is enabled to enter data provided by complementary data input signals D and $\overline{D}$ received at complementary data input terminals 17 and 18 respectively, while the data provided by complementary output signals Q and $\overline{Q}$ at complementary output terminals 20 and 21 of the slave latch circuit 11 remains unchanged. During the next complementary clock signal interval, the entered data is transferred from the latch circuit 10 to the data output terminals 20, 21 of the slave latch circuit 11.

The master latch circuit 10 includes a differential pair of first and second bipolar transistors Q1 and Q2 having their bases respectively coupled to lines 13 and 14 for receiving the complementary clock signals CLK and $\overline{CLK}$. The collector of the transistor Q1 is coupled to the emitters of a differential pair of third and fourth bipolar transistors Q3 and Q4. The collector of the transistor Q2 is coupled to the emitters of a differential pair of fifth and sixth bipolar transistors Q5 and Q6. The basis of the transistors Q3 and Q4 are connected respectively to the complementary data input terminals 17 and 18.

The master latch circuit 10 further includes an emitter-follower pair of seventh and eighth bipolar transistors Q7 and Q8. The base of the transistor Q7 is coupled to the collectors of transistors Q3 and Q5. The base of transistor Q8 is coupled to the collectors of the transistors Q4 and Q6. The emitters of the transistors Q7 and Q8 are cross-coupled respectively to the bases of the transistors Q6 and Q5.

In the slave latch circuit 11 the transistors Q1', Q2', Q3', Q4', Q5', Q6', Q7', and Q8' are connected in the same manner as the corresponding numbered transistors Q1, Q2...Q8 in the master latch circuit 10, except that the bases of the transistors Q3' and Q4' are connected respectively to the emitters of the transistors Q7 and Q8 in the master latch circuit 10, the collector of the transistor Q2' is connected to the emitters of the transistors Q3' and Q4', the collector of the transistor Q1' is connected to the emitters of the transistors Q5' and Q6', and the emitters of the transistors Q7' and Q8' in the slave latch circuit 11 also are connected respectively to the complementary output terminals 20 and 21.

Referring to the master latch circuit 10, when the clock signal CLK is high and the clock signal $\overline{CLK}$ is low, transistor Q1 is rendered conductive so as to enable the transistors Q3 and Q4 to respond to the complementary input data signals D and $\overline{D}$, by being driven to different logic conditions.

During the complementary clock interval, when the clock signal CLK is low and the clock signal $\overline{CLK}$ is high, the transistor Q2 is rendered conductive so as to enable the transistors Q5 and Q6 to latch the input data signals from the collectors of transistors Q3 and Q4 onto the emitters of transistors Q7 and Q8.

The slave latch circuit operates in the same manner to transfer the data signals from the emitters of the transistors Q7 and Q8 through to the complementary output terminals 20 and 21.

This typical master-slave flip-flop includes a total of sixteen transistors.

It is an object of the present invention to provide a master-slave flip-flop that is significantly less complex than typical prior art master-slave flip-flops.

SUMMARY OF THE INVENTION

The present invention provides a master-slave flip-flop, wherein a master latch circuit and a slave latch circuit each include only one pair of single emitter bipolar transistors and one pair of dual-emitter bipolar emitter-follower transistors. In each circuit the first emitters of the dual-emitter transistors are cross-coupled to the bases of the single emitter transistors, and the bases of the dual-emitter transistors are coupled to the collectors of the single-emitter transistors. In the master latch circuit the bases of the single-emitter transistors are respectively coupled to complementary data input terminals. The bases of the single-emitter transistors in the slave latch circuit are coupled to the second emitters of the dual-emitter transistors of the master slave latch circuit. The second emitters of the dual emitter transistors of the slave latch circuit are coupled to complementary output terminals. The emitter-follower transistors of the master and slave latch circuits are respectively clocked by complementary clock signals applied to their bases. During one clock signal interval the master latch circuit latches the complementary data signals from the complementary data input terminals onto the second emitter terminals of its emitter-follower transistors, while the signal state on the complementary output terminals from the slave latch circuit remain unchanged. During the complementary clock signal interval the data signals from the second emitter terminals of the master latch circuit are latched onto the complementary output terminals.

The master-slave flip-flop of the present invention is significantly less complex than prior art master-slave flip-flops, and requires much less die area in an integrated circuit embodiment thereof. Also, the smaller size allows faster operation of the master-slave flip-flop of the present invention with the same amount of power consumption as the prior art flip-flop, because of the lower capacitance that is incident to the smaller size.

In addition, the master-slave flip-flop of the present invention enables a less complex clock buffer circuit to be used therewith, as is discussed in the description of the preferred embodiment.

DESCRIPTION OF THE PREFERRED EMBODIMENT

Figure 2:
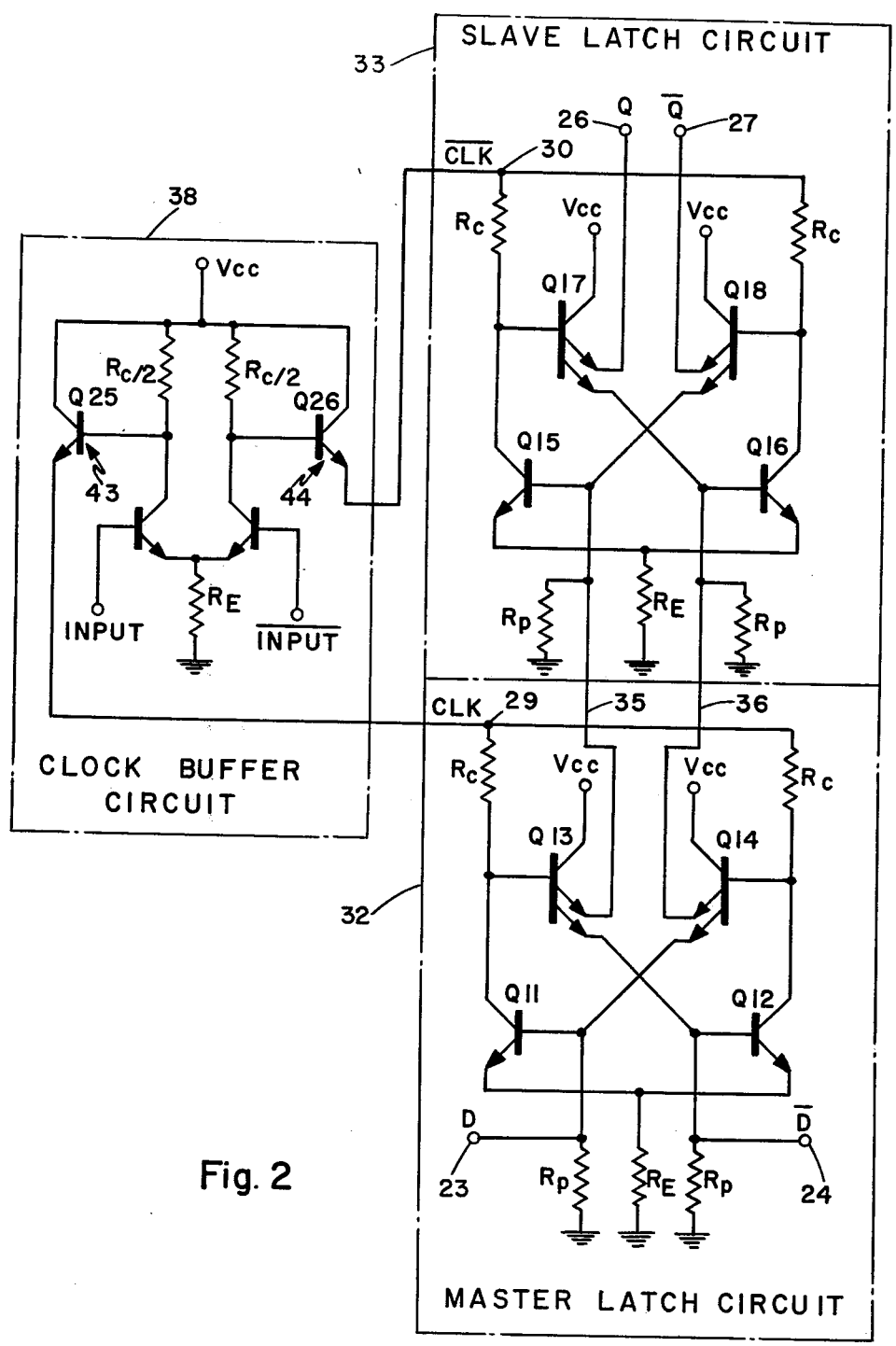
FIG. 2 is a schematic circuit diagram showing a master-slave flip-flop according to the present invention and a clock buffer circuit which may be used therewith.

Referring to FIG. 2, a preferred embodiment of the master-slave flip-flop of the present invention includes first and second complementary data input terminals 23 and 24 for receiving complementary data input signals D and $\overline{D}$; first and second complementary output terminals 26 and 27 for providing complementary output signals Q and $\overline{Q}$; first and second complementary clock input terminals 29 and 30 for receiving complementary clock input signals CLK and $\overline{CLK}$; a master latch circuit 32 and a slave latch circuit 33.

The master latch circuit 32 includes a differential pair of first and second single-emitter bipolar transistors Q11 and Q12 having their bases respectively coupled to the first and second complementary data input terminals 23 and 24, and their collectors coupled to the first clock input terminal 29; and a pair of first and second dual-emitter bipolar emitter-follower transistors Q13 and Q14 having their bases respectively coupled to the collectors of the first and second single-emitter transistors Q11 and Q12, and their first emitters respectively cross-coupled to the bases of the second and first single emitter transistors Q12 and Q11.

The slave latch circuit 33 includes a pair of third and fourth single-emitter bipolar transistors Q15 and Q16 having their bases respectively coupled via lines 35 and 36 to the second emitters of the first and second dual-emitter transistors Q13 and Q14 and their collectors coupled to the second clock input terminal 30; and a pair of third and fourth dual-emitter bipolar emitter-follower transistors Q17 and Q18 having their bases respectively coupled to the collectors of the third and fourth single-emitter transistors Q15 and Q16, their first emitters respectively cross-coupled to the bases of the fourth and third single-emitter transistors Q16 and Q15, and their second emitters respectively coupled to the first and second complementary output terminals 26 and 27.

When the CLK signal at terminal 29 is low, the input data signals D and $\overline{D}$ override any previously existing data signals latched onto the first emitters of the transistors Q13 and Q14 and is thereby latched onto the second emitters of the transistors Q13 and Q14 in the master latch circuit 32. At the same time, the $\overline{CLK}$ signal at terminal 30 is high, thereby preventing the data signals on lines 35 and 36 from the second emitters of transistors Q13 and Q14 from overriding the existing data previously latched onto the first emitters of the transistors Q17 and Q18. Thus during this clock interval while data signals D and $\overline{D}$ are being entered into the master latch circuit 32, the state of the complementary output signals Q and $\overline{Q}$ provided at the output terminals 26 and 27 connected to the second emitters of the transistors Q17 and Q18 in the slave latch circuit 33 remains unchanged.

During the complementary clock signal interval when the CLK signal at terminal 29 is high and the $\overline{CLK}$ signal at terminal 30 is low, the level of the signals on the first emitters of the transistors Q13 and Q14 in the master latch circuit 32 is sufficiently high to override the input data signals D and $\overline{D}$ received at the bases of the transistors Q11 and Q12 and thereby prevent the entry of new data into the master latch circuit 32. However, with the $\overline{CLK}$ signal at terminal 30 being low, the data signals on lines 35 and 36 override the previously existing data signals latched onto the first emitters of the transistors Q17 and Q18 and thereby are latched onto the second emitters of the transistors Q17 and Q18 in the slave latch circuit 33, and are provided as complementary output signals Q and $\overline{Q}$ at the complementary output terminals 26 and 27.

Figure 1:
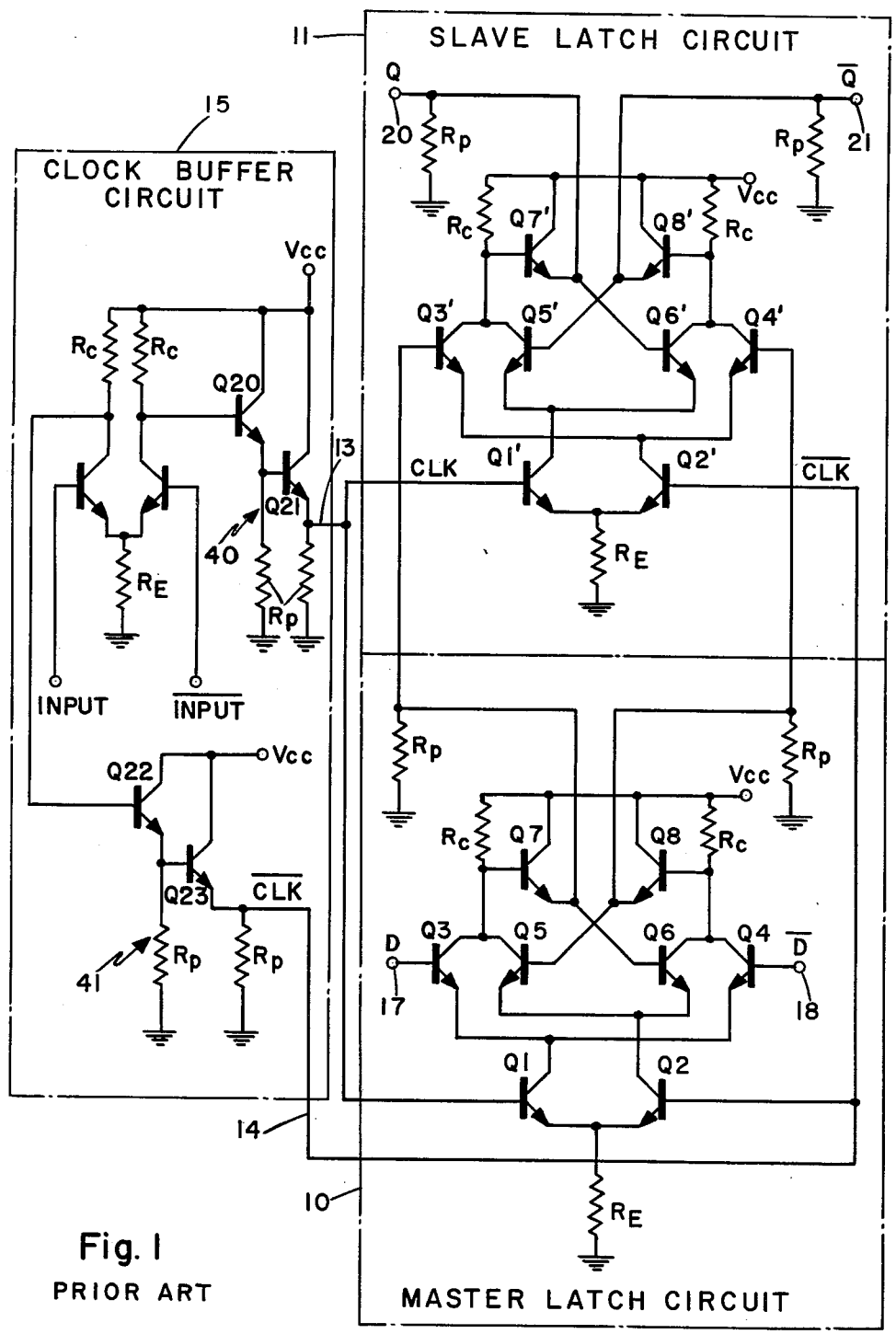
FIG. 1 is a schematic circuit diagram showing a typical prior art master-slave flip-flop and a clock buffer circuit used therewith.

The master-slave flip-flop of the present invention enables the use of a clock buffer circuit 38 therewith, that is less complex than the clock buffer circuit 15 used with the prior art master-slave flip-flop shown in FIG. 1. For operation of the prior art master-slave flip-flop, the low level of the complementary clock signals CLK and $\overline{CLK}$ must be considerably lower than for operation of the master-slave flip-flop of the present invention (FIG. 2). Accordingly the output stages 40 and 41 of the clock buffer circuit 15 used with the prior art master-slave flip-flop each include two emitter-follower transistors, Q20, Q21 and Q22, Q23 respectively; whereas the output stages 43 and 44 of the clock buffer circuit 38 used with the master-slave flip-flop of the present invention each include only one emitter-follower transistor Q25 and Q26 respectively.

I claim:
1. A master-slave flip-flop, comprising
first and second complementary data input terminals for receiving complementary data input signals;
first and second complementary output terminals;
first and second complementary clock input terminals for receiving complementary clock input signals;
a master latch circuit, including
a differential pair of first and second single-emitter bipolar transistors having their bases respectively coupled to the first and second complementary data input terminals, and their collectors coupled to the first clock input terminal; and
a pair of first and second dual-emitter bipolar emitter-follower transistors having their bases respectively coupled to the collectors of the first and second single-emitter transistors, and their first emitters respectively cross-coupled to the bases of the second and first single emitter transistors; and
a slave latch circuit, including
a pair of third and fourth single-emitter bipolar transistors having their bases respectively coupled to the second emitters of the first and second dual-emitter transistors, and their collectors coupled to the second clock input terminal; and
a pair of third and fourth dual-emitter bipolar emitter-follower transistors having their bases respectively coupled to the collectors of the third and fourth single-emitter transistors, their first emitters respectively cross-coupled to the bases of the fourth and third single-emitter transistors, and their second emitters respectively coupled to the first and second complementary output terminals.

* * * * *